United States Patent
Watanabe et al.

(10) Patent No.: US 10,454,053 B2
(45) Date of Patent: *Oct. 22, 2019

(54) LIGHT-EMITTING DEVICE WITH A FIRST AND A SECOND OPTICAL FILTER

(71) Applicant: Pioneer Corporation, Bunkyo-ku, Tokyo (JP)

(72) Inventors: Teruichi Watanabe, Yonezawa (JP); Hiroki Tan, Yonezawa (JP); Isamu Ohshita, Tokyo (JP)

(73) Assignee: PIONEER CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/077,031

(22) PCT Filed: Feb. 10, 2017

(86) PCT No.: PCT/JP2017/004915
§ 371 (c)(1),
(2) Date: Aug. 9, 2018

(87) PCT Pub. No.: WO2017/138632
PCT Pub. Date: Aug. 17, 2017

(65) Prior Publication Data
US 2019/0036057 A1 Jan. 31, 2019

(30) Foreign Application Priority Data
Feb. 12, 2016 (JP) .................... 2016-025292

(51) Int. Cl.
*H01L 51/50* (2006.01)
*G02B 5/22* (2006.01)
(Continued)

(52) U.S. Cl.
CPC ............ *H01L 51/5012* (2013.01); *G02B 5/22* (2013.01); *H01L 51/50* (2013.01); *H05B 33/04* (2013.01); *H05B 33/22* (2013.01)

(58) Field of Classification Search
CPC ..... H01L 51/5012; H01L 51/50; H05B 33/04; H05B 33/22; G02B 5/22
See application file for complete search history.

(56) References Cited

U.S. PATENT DOCUMENTS 8,319,419 B2 11/2012 Kodama et al.
8,466,466 B2 6/2013 Ha et al.
(Continued)

FOREIGN PATENT DOCUMENTS

JP 2006-054200 A 2/2006
JP 2007-115626 A 5/2007
(Continued)

OTHER PUBLICATIONS

International Search Report from related International application No. PCT/JP2017/004915, dated Apr. 18, 2017; 2 pages.

*Primary Examiner* — Tracie Y Green
(74) *Attorney, Agent, or Firm* — Procopio, Cory, Hargreaves & Savitch LLP

(57) ABSTRACT

A plurality of light-emitting units (140) are provided on a first surface (100*a*) of a substrate (100), separated from each other. Each light-emitting unit (140) includes a light-transmitting first electrode (110), an organic layer (120), and alight-reflective second electrode (130). The organic layer (120) is located between the first electrode (110) and the second electrode (130). A light-transmitting region is located between the light-emitting units (140) and transmits light in the thickness direction of a light-emitting device (10). An
(Continued)

optical filter (200) is overlapped with the light-emitting unit (140) and not overlapped with at least a portion of the light-transmitting region.

9 Claims, 8 Drawing Sheets

(51) Int. Cl.
*H05B 33/22* (2006.01)
*H05B 33/04* (2006.01)

(56) References Cited

U.S. PATENT DOCUMENTS

| | | |
|---|---|---|
| 8,766,533 B2 | 7/2014 | Kobayashi |
| 8,963,815 B2 | 2/2015 | Park |
| 9,117,779 B2 | 8/2015 | Ha et al. |
| 9,165,985 B2 | 10/2015 | Ha et al. |
| 9,666,654 B2 | 5/2017 | Ha et al. |
| 9,721,998 B2 | 8/2017 | Yamazaki |
| 2004/0113532 A1* | 6/2004 | Oishi ............... H01J 29/86 313/110 |
| 2010/0067115 A1* | 3/2010 | Oishi ............... H01J 11/12 359/613 |
| 2010/0314616 A1 | 12/2010 | Kodama et al. |
| 2011/0148944 A1 | 6/2011 | Kobayashi |
| 2011/0220901 A1 | 9/2011 | Ha et al. |
| 2012/0280894 A1 | 11/2012 | Park |
| 2013/0113843 A1 | 5/2013 | Yamazaki |
| 2013/0240864 A1 | 9/2013 | Ha et al. |
| 2013/0313539 A1 | 11/2013 | Ha et al. |
| 2014/0252336 A1 | 9/2014 | Kobayashi |
| 2016/0043156 A1 | 2/2016 | Ha et al. |
| 2017/0256598 A1 | 9/2017 | Ha et al. |
| 2017/0271415 A1 | 9/2017 | Yamazaki |
| 2019/0049637 A1* | 2/2019 | Watanabe ............ G02B 5/22 |

FOREIGN PATENT DOCUMENTS

| | | |
|---|---|---|
| JP | 2011-023336 A | 2/2011 |
| JP | 2011-129392 A | 6/2011 |
| JP | 2011-228249 A | 11/2011 |
| JP | 2012-234798 A | 11/2012 |
| JP | 2013-117719 A | 6/2013 |

\* cited by examiner

LIGHT-EMITTING DEVICE WITH A FIRST AND A SECOND OPTICAL FILTER

CROSS-REFERENCE TO RELATED APPLICATIONS

This application is a U.S. National Stage entry of PCT Application No: PCT/JP2017/004915 filed Feb. 10, 2017, which claims priority to Japanese Patent Application No. 2016-025292, filed Feb. 12, 2016, the contents of which are incorporated herein by reference.

TECHNICAL FIELD

The present invention relates to a light-emitting device.

BACKGROUND ART

In recent years, there has been progress in the development of light-emitting devices using organic EL. Such light-emitting devices are used as illumination devices or display devices and configured of an organic layer interposed between a first electrode and a second electrode. Generally, a transparent material is used for the first electrode, and a metal material is used for the second electrode.

One of the light-emitting devices which utilizes the organic EL is a technology described in Patent Document 1. In order to provide a display device using organic EL with optical transparency (or a "see-through" property), the technology in Patent Document 1 provides second electrodes only in a portion of a pixel. In such a configuration, since a region located between a plurality of second electrodes transmits light, the display device is capable of having optical transparency. Meanwhile, in the technology described in Patent Document 1, between a plurality of the second electrodes, a light-transmitting insulating film is formed to define the pixel. Examples of materials of the insulating film of Patent Document 1 include an inorganic material such as a silicon oxide and a resin material such as an acrylic resin.

RELATED ART DOCUMENT

Patent Document

[Patent Document 1]: Japanese Unexamined Patent Application Publication No. 2011-23336

SUMMARY OF THE INVENTION

Depending on the use of a light-emitting device, an emission spectrum peak of the light-emitting device is preferably sharp. In order to achieve this, for example, the light-emitting device may be overlapped by an optical filter. However, when the optical filter is provided in the light-transmitting light-emitting device, translucency thereof decreases.

An example of the problem to be solved by the present invention is to obtain a sharp peak of emission spectrum of a light-transmitting light-emitting device while inhibiting translucency of the light-emitting device from decreasing.

Means for Solving the Problem

The invention described in claim 1 is a light-emitting device including:
a light-transmitting substrate;
a plurality of light-emitting units which are provided separated from each other on a first surface of the substrate, each light-emitting unit including a light-transmitting first electrode, a light-reflective second electrode, and an organic layer located between the first electrode and the second electrode;
a light-transmitting region located between the light-emitting units, the region transmitting light in a thickness direction, and
an optical filter provided on a light-emitting surface of the substrate, the optical filter overlapped with the light-emitting unit and not overlapped with at least a portion of the light-transmitting region.

BRIEF DESCRIPTION OF THE DRAWINGS

The objects described above, and other objects, features and advantages are further made apparent by a suitable embodiment that will be described below and the following accompanying drawings.

DESCRIPTION OF EMBODIMENT

Figure 1:
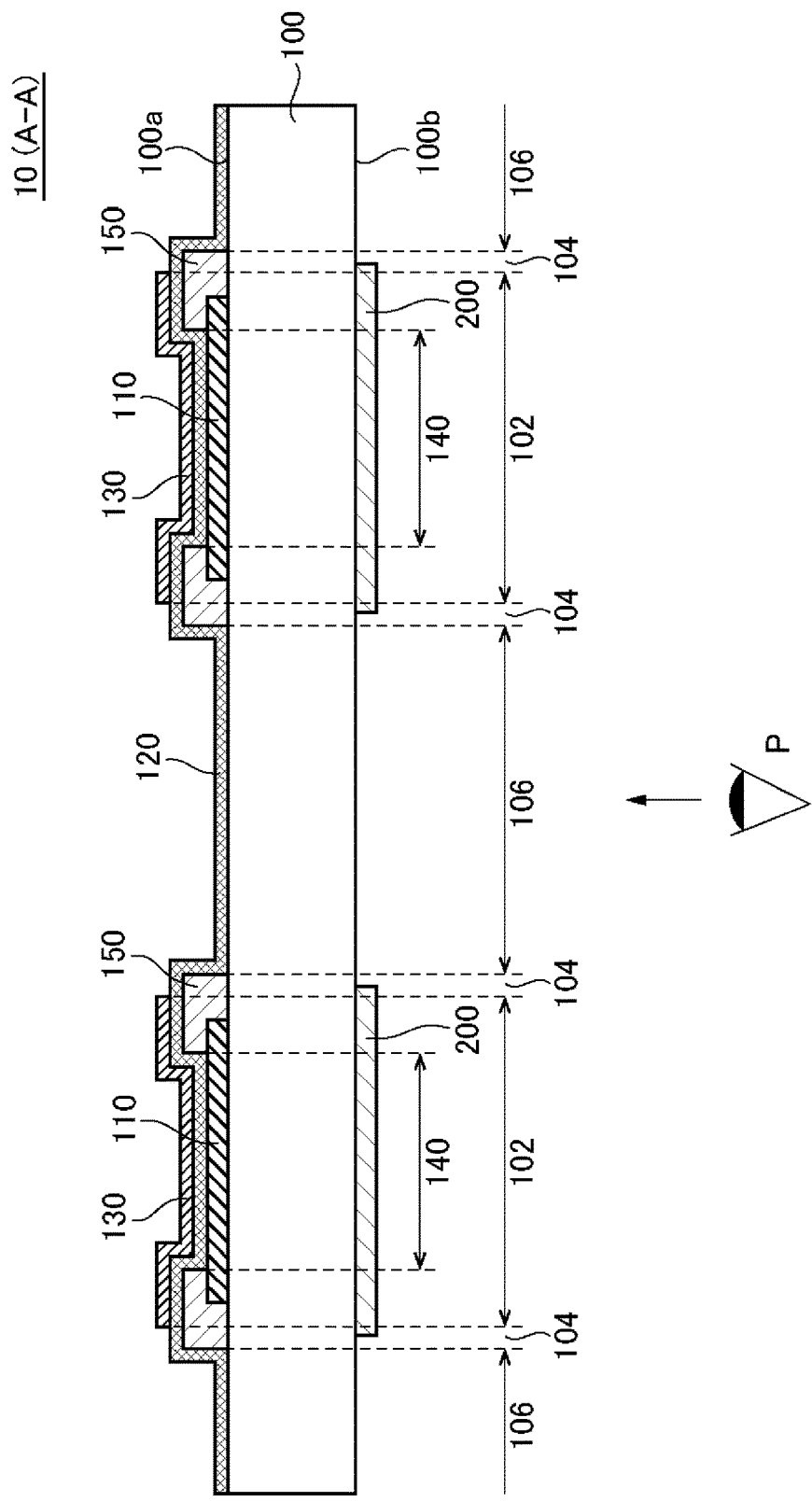
FIG. 1 is a cross-sectional view of a light-emitting device according to an embodiment.

An embodiment of the present invention will be described below by referring to the drawings. Moreover, in all the drawings, the same constituent elements are given the same reference numerals, and descriptions thereof will not be repeated.

Figure 2:
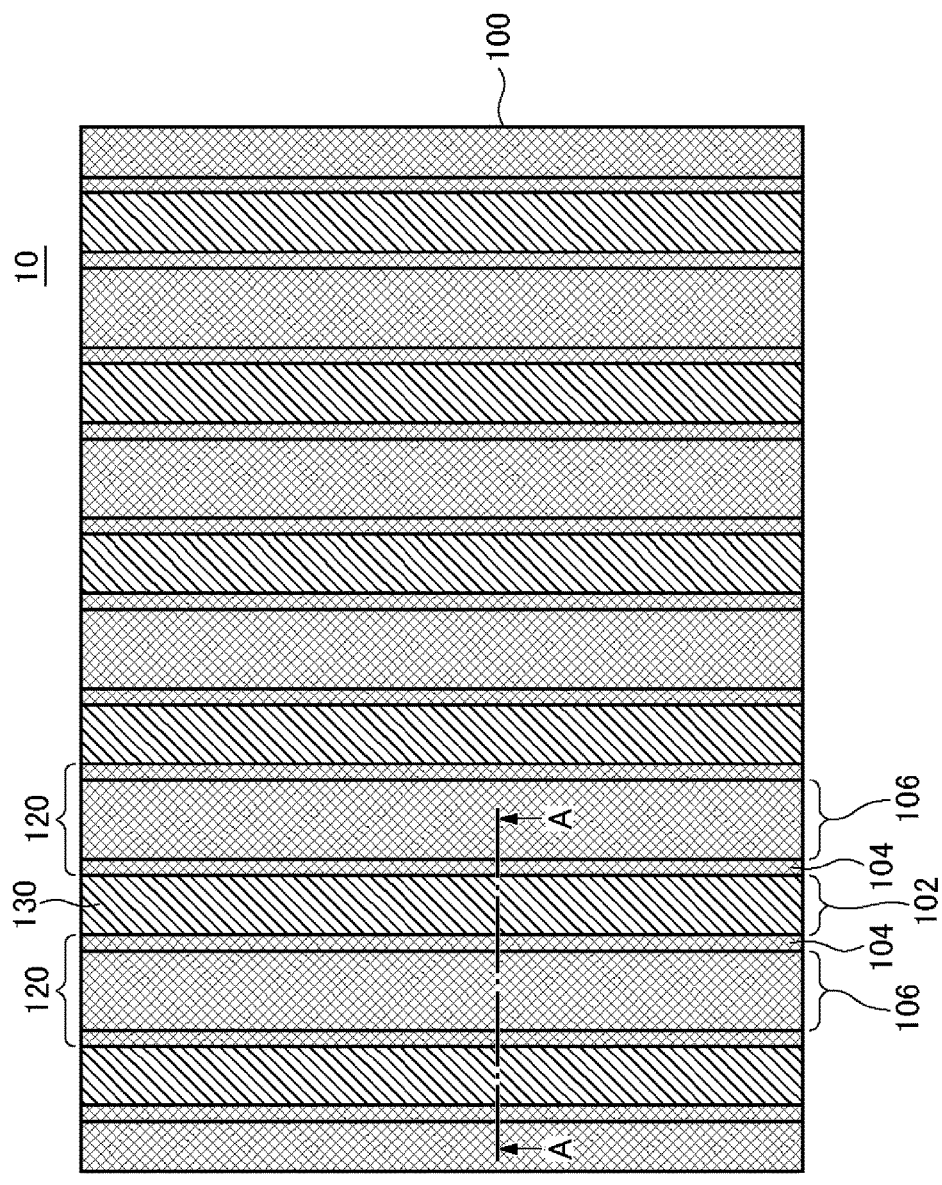
FIG. 2 is a plan view of the light-emitting device

FIG. 1 is a cross-sectional view of a configuration of a light-emitting device 10 according to an embodiment. FIG. 2 is a plan view of the light-emitting device 10. FIG. 1 corresponds to a cross-sectional view taken along line A-A of FIG. 1. The light-emitting device 10 according to the embodiment includes a light-transmitting substrate 100, a plurality of light-emitting units 140, a light-transmitting region (a second region 104 and a third region 106), and a first optical filter 200. The plurality of light-emitting units 140 are provided on a first surface 100a of the substrate 100, separated from each other. Each of the plurality of light-emitting units 140 includes a light-transmitting first electrode 110, an organic layer 120, and a light-reflective second electrode 130. The organic layer 120 is located between the first electrode 110 and the second electrode 130. A light-transmitting region is located between the light-emitting units 140 and transmits light in the thickness direction of the light-emitting device 10. The optical filter 200 is overlapped with the light-emitting unit 140 and not overlapped with at least a portion of the light-transmitting region. In the example shown in the drawing, the first optical filter 200 is provided on a second surface 100b of the substrate 100. A detailed description will be provided below.

The substrate 100 is, for example, a glass substrate or a resin substrate which has optical transparency. The substrate 100 may have flexibility. In a case where the substrate has flexibility, the thickness of the substrate 100 is, for example, equal to or greater than 10 μm and equal to or less than 1,000 μm. The substrate 100 is polygonal, for example, rectangular, or round. In a case where the substrate 100 is a resin substrate, the substrate 100 is formed using, for example, polyethylene naphthalate (PEN), polyether sulphone (PES), polyethylene terephthalate (PET), or polyimide. In addition, in a case where the substrate 100 is a resin substrate, an inorganic barrier film of SiNx, SiON or the like is formed on at least one surface (preferably, both surfaces) of the substrate 100 in order to prevent moisture from permeating the substrate 100. Meanwhile, in a case where the substrate 100 is a resin substrate, methods of forming the light-emitting device 10 include directly depositing the first electrode 110 and the organic layer 120 on the resin substrate, to be described later, and forming the first electrode 110 and layers that follow directly on a glass substrate, peeling the first electrode 110 from the glass substrate, and thereafter, placing the peeled laminate on a resin substrate.

The light-emitting unit 140 is formed on a surface of the substrate 100. The light-emitting unit 140 has a configuration in which the first electrode 110, the organic layer 120 including a light-emitting layer, and the second electrode 130 are laminated in this order. In a case where the light-emitting device 10 is a lighting device, the plurality of the light-emitting units 140 extend in a line-shape (for example, linearly). The plurality of the light-emitting units 140 preferably extend in parallel to each other. Meanwhile, in a case where the light-emitting device 10 is a display device, the plurality of the light-emitting units 140 may be disposed so as to constitute a matrix, constitute a segment, or display a predetermined shape (for example, to display an icon). In addition, each of the plurality of light-emitting units 140 is formed for each pixel.

The first electrode 110 is a transparent electrode which has optical transparency. A material of the transparent electrode contains a metal, for example, a metal oxide such as an indium tin oxide (ITO), an indium zinc oxide (IZO), an indium tungsten zinc oxide (IWZO), a zinc oxide (ZnO), or the like. The thickness of the first electrode 110 is, for example, equal to or greater than 10 nm and equal to or less than 500 nm. The first electrode is formed by, for example, sputtering or vapor deposition. Moreover, the first electrode 110 may be a conductive organic material such as carbon nanotubes or PEDOT/PSS. Further, the first electrode 110 may have a laminated structure in which a plurality of layers are laminated. In the drawing, a plurality of linear first electrodes 110 are formed in parallel to each other on the substrate 100. Thus, the first electrode 110 is not located in the second region 104 and the third region 106.

The organic layer 120 includes a light-emitting layer. The organic layer 120 has a configuration in which, for example, a hole injection layer, a light-emitting layer, and an electron injection layer are laminated in this order. A hole transport layer may be formed between the hole injection layer and the light-emitting layer. In addition, an electron transport layer may be formed between the light-emitting layer and the electron injection layer. The organic layer 120 may be formed using vapor deposition. In addition, at least one layer of the organic layer 120, for example, a layer which is in contact with the first electrode 110, may be formed using a coating method such as ink jetting, printing, or spraying. Meanwhile, in this case, the remaining layers of the organic layer 120 are formed using vapor deposition. In addition, all layers of the organic layer 120 may be formed using a coating method. Meanwhile, instead of the organic layer 120, another light-emitting layer (for example, an inorganic light-emitting layer) may be included. Further, a luminescent color radiated by a light-emitting layer (or a color of light emitted from the organic layer 120) may be the same or different from a luminescent color (or a color of light emitted from the organic layer 120) of a light-emitting layer of an adjacent light-emitting unit 140.

The second electrode 130 includes a metal layer composed of a metal selected from a first group including, for example, Al, Au, Ag, Pt, Mg, Sn, Zn, and In, or an alloy of metals selected from the first group. Therefore, the second electrode 130 has light shielding properties or light reflectivity. The thickness of the second electrode 130 is, for example, equal to or greater than 10 nm and equal to or less than 500 nm. The second electrode 130 is formed by, for example, sputtering or vapor deposition. In the example shown in the drawing, the light-emitting device 10 includes a plurality of linear second electrodes 130. Each second electrode 130 is provided per each of the first electrodes 110, and the width thereof is wider than that of the first electrode 110. Therefore, in a case where viewed from a direction perpendicular to the substrate 100, in a width direction, the entirety of the first electrode 110 is overlapped and covered by the second electrode 130. By adopting such a configuration, the extraction direction of light emitted by the light-emitting layer of the organic layer 120 may be adjusted. Specifically, emission of light to the first surface 100a side of the light-emitting device 10 may be inhibited. Alternatively, the width of the first electrode 110 may be wider than that of the second electrode 130, and when viewed in a direction perpendicular to the substrate, the entirety of the second electrode 130 may be covered by the first electrode 110 in the width direction. In this case, a relatively large amount of light is emitted toward the side of the light-emitting device 10 on which the second electrode 130 is formed.

The edge of the first electrode 110 is covered by an insulating film 150. The insulating film 150 is formed of, for example, a photosensitive resin material such as polyimide and surrounds a portion of the first electrode 110 serving as the light emitting unit 140. In other words, the insulating film 150 defines the light-emitting unit 140. The insulating film 150 is light-transmitting, but light transmittance thereof is not required to be high. An edge of the second electrode 130 in the width direction is located above the insulating film 150. In other words, when viewed from a direction perpendicular to the extending direction of the light-emitting unit 140, a portion of the insulating film 150 protrudes from the second electrode 130. In addition, in the example shown in the drawing, the organic layer 120 is formed on top and side of the insulating film 150.

When viewed from the direction perpendicular to the extending direction of the light-emitting unit 140 (that is, the cross-sectional view in FIG. 1), the light-emitting device 10 includes a first region 102, a second region 104, and a third region 106.

The first region 102 overlaps the second electrode 130. In other words, when viewed from the direction perpendicular to the substrate 100, the first region 102 is covered by the second electrode 130, and the width thereof is the same as or wider than that of the light-emitting unit 140. In the example shown in the drawing, the width of the first region 102 is wider than that of the light-emitting unit 140. The first region 102 does not transmit light either from a front surface to a rear surface or from the rear surface to the front surface of the light-emitting device 10 or the substrate 100.

In addition, a region located between the second electrodes 130 is a light-transmitting region. This light-transmitting region is configured of the second region 104 (a first light-transmitting region) and the third region 106 (a second light-transmitting region). The second region 104 is a region of the light-transmitting region including the insulating film 150. The third region 106 is a region of the light-transmitting region not including the insulating film 150. The light transmittance of the third region 106 is higher that of the second region 104.

The width of the second region 104 is narrower than that of the third region 106. Therefore, the light-emitting device 10 includes sufficient optical transparency. Further, the width of the third region 106 may be wider or narrower than that of the first region 102. In a case where the width of the first region 102 is 1, the width of the second region 104 is, for example, equal to or greater than 0 (or more than 0 or equal to or greater than 0.1) and equal to or less than 0.2, and the width of the third region 106 is, for example, equal to or greater than 0.3 and equal to or less than 2. Further, the width of the first region 102 is, for example, equal to or greater than 50 μm and equal to or less than 500 μm, the width of the second region 104 is, for example, equal to or greater than 0 μm (or more than 0 μm) and equal to or less than 100 μm, and the width of the third region 106 is, for example, equal to or greater than 15 μm and equal to or less than 1,000 μm.

Meanwhile, in the example shown in FIG. 1, at least one organic layer 120 is formed continuously in the first region 102, the second region 104, and the third region 106. In other words, the organic layers 120 of the plurality of the light-emitting units 140 are formed continuously. With such a configuration, it is not necessary to use a mask when forming a continuous layer of the organic layers 120, and thus manufacturing costs of the organic layer 120 may be reduced. However, the organic layer 120 is not required to be formed in the third region 106. In addition, the organic layer 120 is not required to be formed in the second region 104.

Further, the light-emitting unit 140 may be in a grid shape. In this case, the third region 106 is a region of the substrate 100 surrounded by the second electrode 130.

The light-emitting device 10 further includes the first optical filter 200. The first optical filter 200 filters a portion of light emitted by the light-emitting unit 140. The first optical filter 200 is a color filter, for example, for obtaining a sharp peak of emission spectrum of the light-emitting unit 140 (in other words, for obtaining a clear luminescent color of the light-emitting device 10). In this case, the peak wavelength of the transmission spectrum of the first optical filter 200 is within the emission spectrum of the light-emitting unit 140. For example, when the emission color of the light-emitting unit 140 is red, the first optical filter 200 is a red filter which transmits red light and does not transmit light of other colors. Further, when the emission color of the light-emitting unit 140 is green, the first optical filter 200 is a green filter which transmits green light and does not transmit light of other colors. In addition, when the emission color of the light-emitting unit 140 is blue, the first optical filter 200 is a blue filter which transmits blue light and does not transmit light of other colors. The first optical filter 200 is, for example, a light-transmitting layer or sheet which is colored a desired color. Further, in a case where the third region 106 transmits visible light, the light transmittance of visible light of a portion of the third region 106 not overlapped with the first optical filter 200 is, for example, equal to or greater than 70% and equal to or less than 95%. In addition, the light transmittance of a portion of the third region 106 overlapped with the first optical filter 200 is equal to or greater than 70% and equal to or less than 95% with respect to light of a wavelength which is transmitted by the first optical filter 200. In addition, the light transmittance of the light-emitting device 10 is equal to or greater than 10% and equal to or less than 90%.

In an example shown in FIG. 1, an edge of the first optical filter 200 overlaps with the second region 104. In other words, the width of the first optical filter 200 is wider than that of the light-emitting unit 140. When such a configuration is adopted, even when variation occurs in the location of the first optical filter 200 with respect to the light-emitting unit 140 or in the width of the first optical filter 200, it is possible to inhibit a portion of the light-emitting unit 140 which is not covered by the first optical filter 200 from occurring. Meanwhile, in the example shown in the drawing, the width of the first optical filter 200 is wider than that of the second electrode 130.

Next, a method of manufacturing the light-emitting device 10 will be described. First, the first electrode 110 is formed on the substrate 100 by, for example, sputtering. Then, the first electrode 110 is formed in a predetermined pattern by, for example, photolithography. Then, the insulating layer 150 is formed over the edge of the first electrode 110. For example, in a case where the insulating layer 150 is formed of a photosensitive resin, the insulating layer 150 is formed in a predetermined pattern by undergoing exposure and development steps. Next, the organic layer 120 and the second electrode 130 are formed in this order. In a case where the organic layer 120 includes a layer which is formed by vapor deposition, the layer is formed in a predetermined pattern, for example, by using a mask or the like. The second electrode 130 is also formed in a predetermined pattern using, for example, a mask. Thereafter, the light-emitting unit 140 is sealed using a sealing member (not shown in the drawing).

Then, the first optical filter 200 is provided on the second surface 100b of the substrate 100. The first optical filter 200 is formed by, for example, coating (for example, screen printing). At this time, the forming position of the first optical filter 200 is determined, for example, based on locations of the insulating film 150 and the second electrode 130. Meanwhile, the first optical filter 200 may be previously formed in a sheet shape. In this case, the first optical filter 200 is attached to the second surface 100b of the substrate 100, by using, for example, an adhesive layer (or a pressure-sensitive adhesive layer).

As described above, according to the present embodiment, the first optical filter 200 covers the light-emitting unit 140 but does not cover at least a portion of the light-transmitting region (in the example illustrated in FIG. 1, the third region 106 and a portion of the second region 104). Therefore, it is possible to obtain a sharp peak of the emission spectrum of the light-emitting unit 140 and to maintain the translucency of the light-emitting device 10.

In addition, when the refractive index of the first optical filter 200 is in between the refractive index of air and the refractive index of the substrate 100, it is possible to increase light extraction efficiency of the light-emitting device 10.

Modification Example 1

Figure 3:
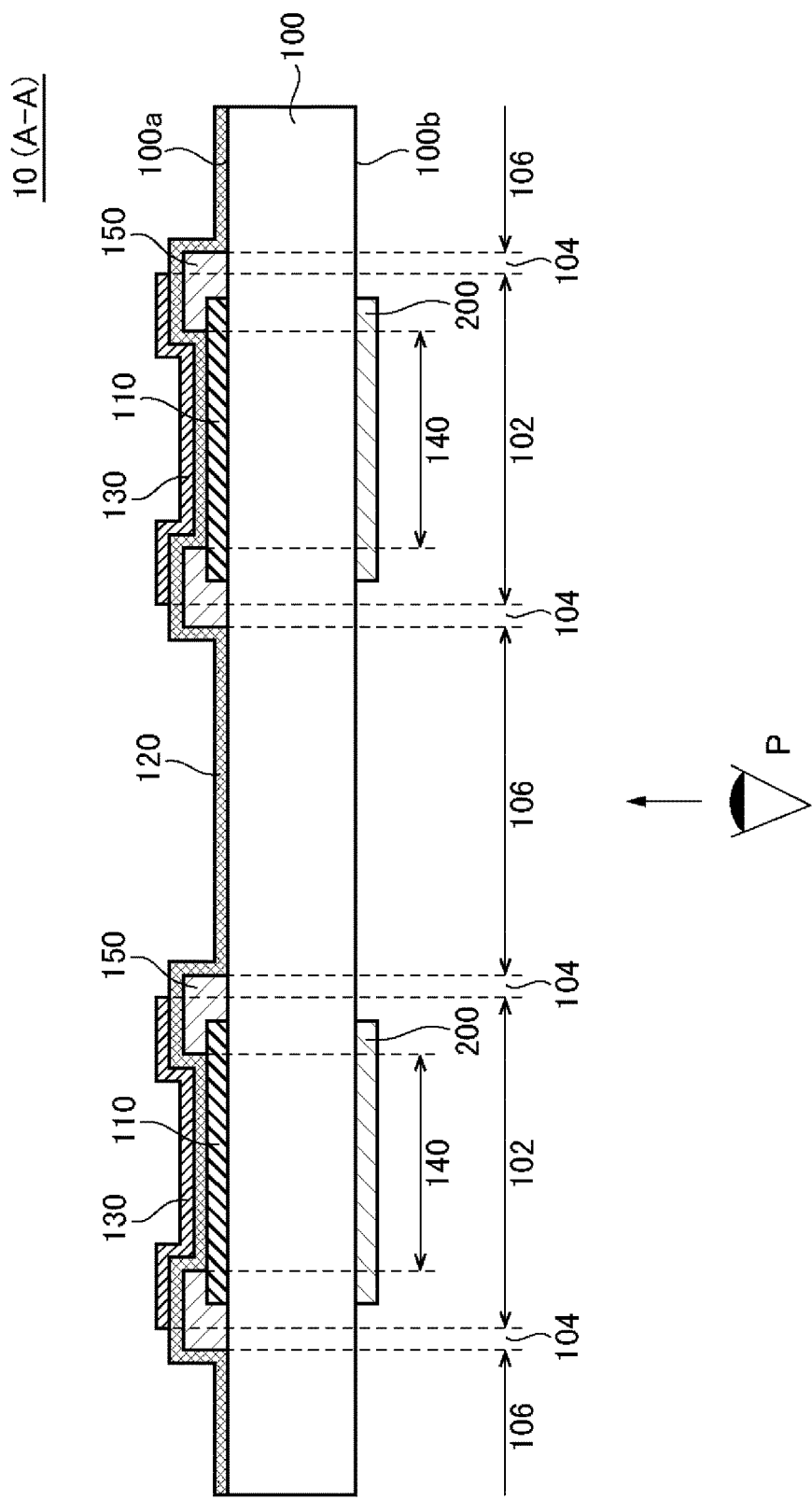
FIG. 3 is a cross-sectional view of a configuration of a light-emitting device according to Modification Example 1.

FIG. 3 is a cross-sectional view of a configuration of a light-emitting device 10 according to Modification Example 1 and corresponds to FIG. 1 of the embodiment. The light-emitting device 10 according to the present modification example has the same configuration as that of the light-emitting device 10 according to the embodiment, except that an edge of the first optical filter 200 is overlapped with a region of the first region 102 other than that of the light-emitting unit 140. In other words, in the present modification example, the edge of the first optical filter 200 is overlapped with the second electrode 130 and the insulating film 150. Further, in other words, the edge of the first optical filter 200 is located between the second region 104 and the light-emitting unit 140.

In the present modification example also, the same as the embodiment, it is possible to obtain a sharp peak of emission spectrum of the light-emitting unit 140 and to maintain translucency of the light-emitting device 10.

Modification Example 2

Figure 4:
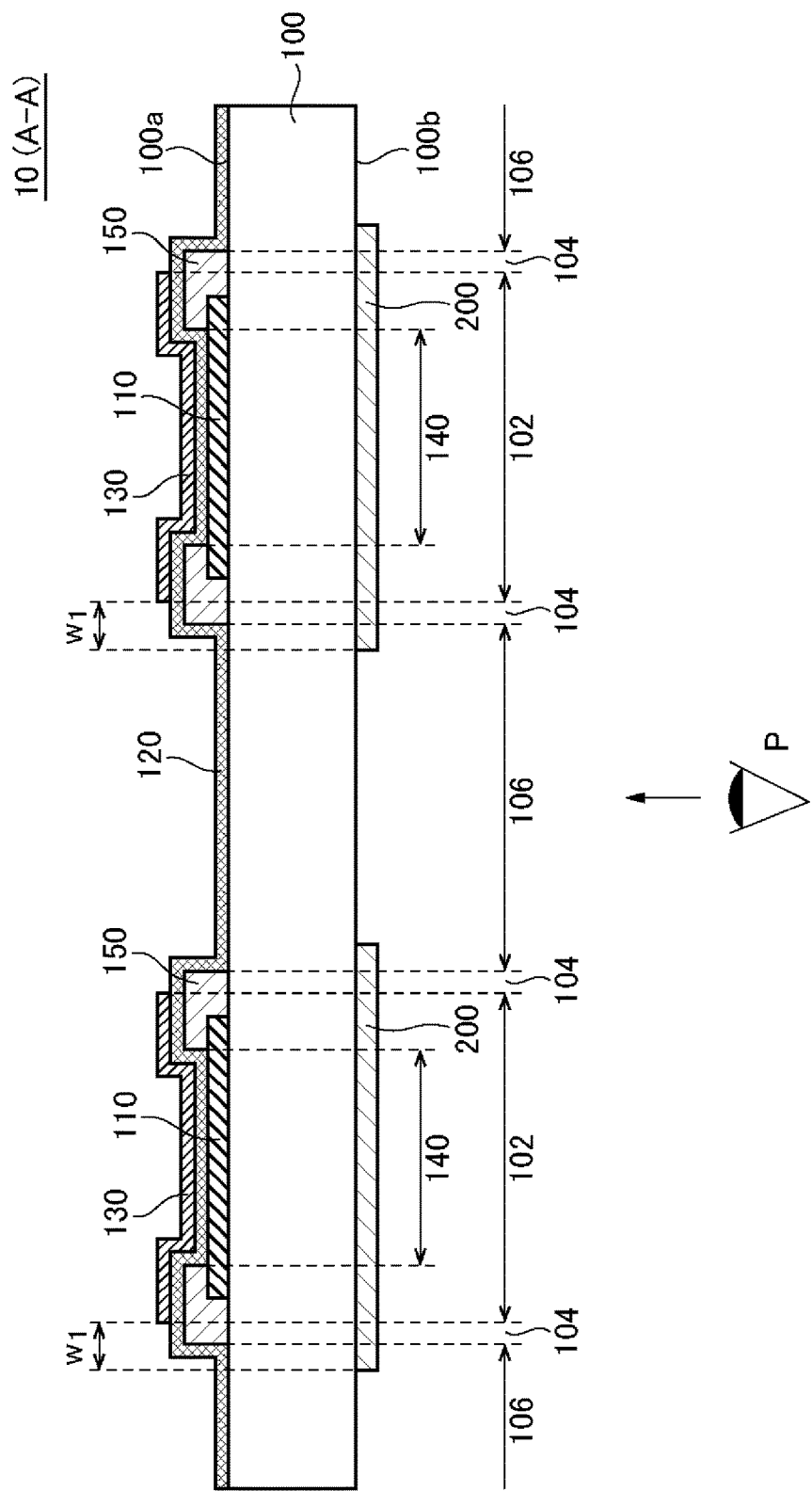
FIG. 4 is a cross-sectional view of a configuration of a light-emitting device according to Modification Example 2.

FIG. 4 is a cross-sectional view of a configuration of a light-emitting device 10 according to Modification Example 2 and corresponds to FIG. 1 of the embodiment. The light-emitting device 10 according to the present modification example has the same configuration as that of the light-emitting device 10 according to the embodiment, except that an edge of the first optical filter 200 is overlapped with a region of the third region 106 that is close to the insulating film 150.

In other words, the first optical filter 200 covers the light-emitting unit 140 and the insulating film 150. Further, an end of the first optical filter 200 protrudes to the third region 106. In addition, a width w1 is preferably equal to or less than 10% of the width of the third region 106. When such a configuration is adopted, even when a portion of the first optical filter 200 protrudes to the third region 106, it is possible to inhibit the light transmittance of the third region 106 (in other words, translucency of the light-emitting device 10) from decreasing. Meanwhile, the width of a portion of one end portion of the first optical filter 200 located in the third region 106 may be the same or different from the width of a portion of the other end portion of the first optical filter 200 located in the third region 106.

In the present modification example also, the same as the embodiment, it is possible to obtain a sharp peak of emission spectrum of the light-emitting unit 140 and to maintain translucency of the light-emitting device 10. Further, since the end of the first optical filter 200 protrudes to the third region 106, even when variation occurs in the location of the first optical filter 200 with respect to the light-emitting unit 140 or in the width of the first optical filter 200, it is possible to inhibit a portion of the light-emitting unit 140 which is not covered by the first optical filter 200 from occurring. It is possible to reduce light from the light-emitting unit 140 that is emitted from the second surface 100b without being transmitted through the first optical filter 200.

Modification Example 3

Figure 5:
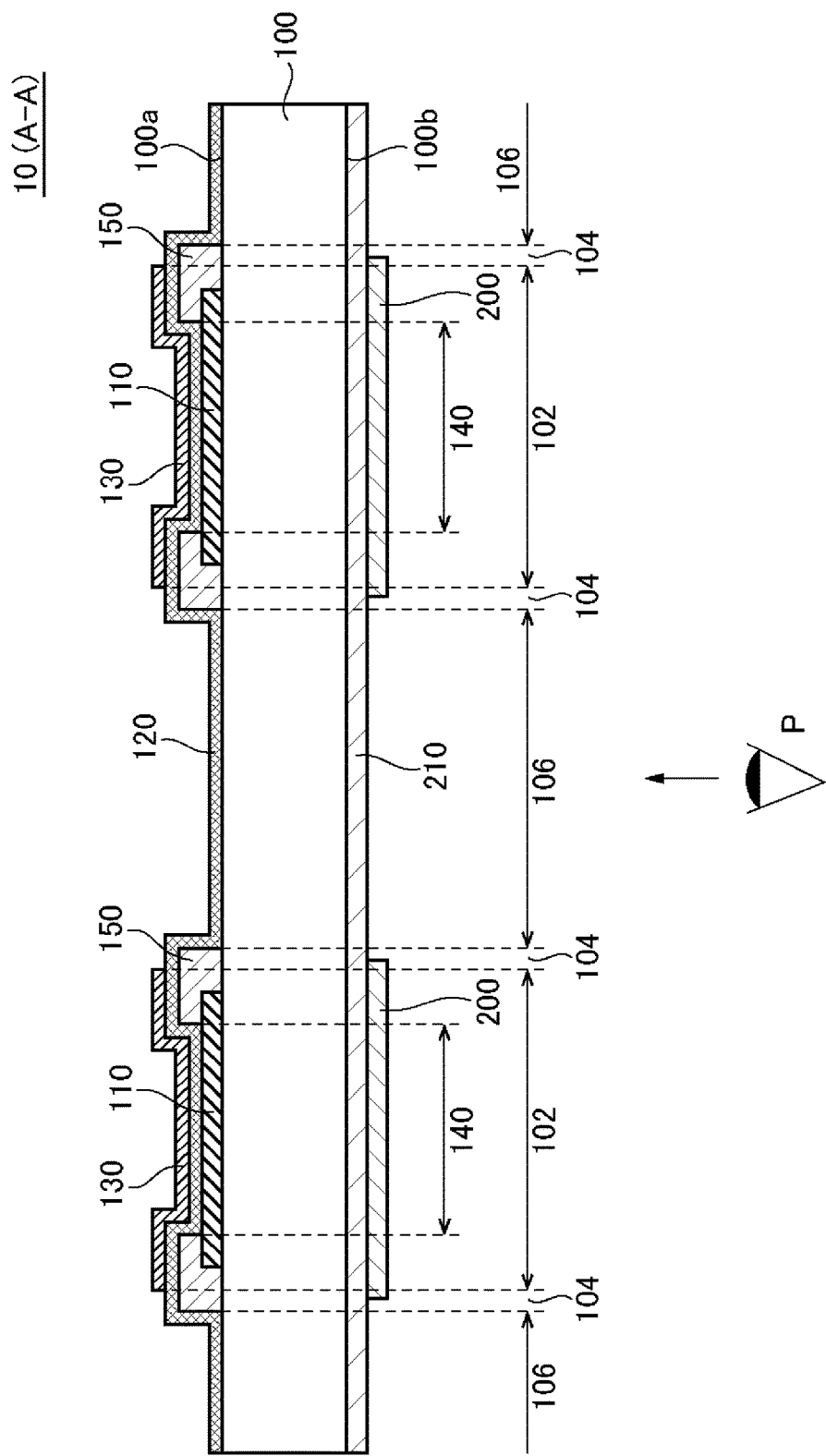
FIG. 5 is a cross-sectional view of a configuration of a light-emitting device according to Modification Example 3.

FIG. 5 is a cross-sectional view of the configuration of a light-emitting device 10 according to Modification Example 3 and corresponds to FIG. 1 of the embodiment. The light-emitting device 10 according to the present modification example has the same configuration as that of the light-emitting device 10 according to the embodiment, except that a sheet member 210 is included.

The sheet member 210 is formed using, for example, transparent resin, and attached to the second surface 100b of the substrate 100 using an adhesive layer or a pressure-sensitive adhesive layer. In addition, the first optical filter 200 is formed in a region of the sheet member 210 which faces the light-emitting unit 140. However, the first optical filter 200 is not formed in a region of the sheet member 210 which is overlapped with the third region 106.

Meanwhile, in the present drawing, the relative position of the first optical filter 200 to the first region 102, the second region 104, and the third region 106 is as described in the embodiment. However, the relative position may be the same as FIG. 2, FIG. 3, or FIG. 4.

Further, in the example shown in the drawing, the first optical filter 200 is provided on a surface of the sheet member 210 on the side opposite to the substrate 100. However, the first optical filter 200 may be provided on a surface of the sheet member 210 which faces the substrate 100 or may be provided in the interior of the sheet member 210. For example, the first optical filter 200 may be formed by coloring a portion of the sheet member 210.

In the present modification example also, the same as the embodiment, it is possible to obtain a sharp peak of emission spectrum of the light-emitting unit 140 and to maintain translucency of the light-emitting device 10. Further, since the first optical filter 200 can be attached to the substrate 100 by sticking the sheet member 210 to the substrate 100, it is possible to easily attach the first optical filter 200 to the substrate 100.

Modification Example 4

Figure 6:
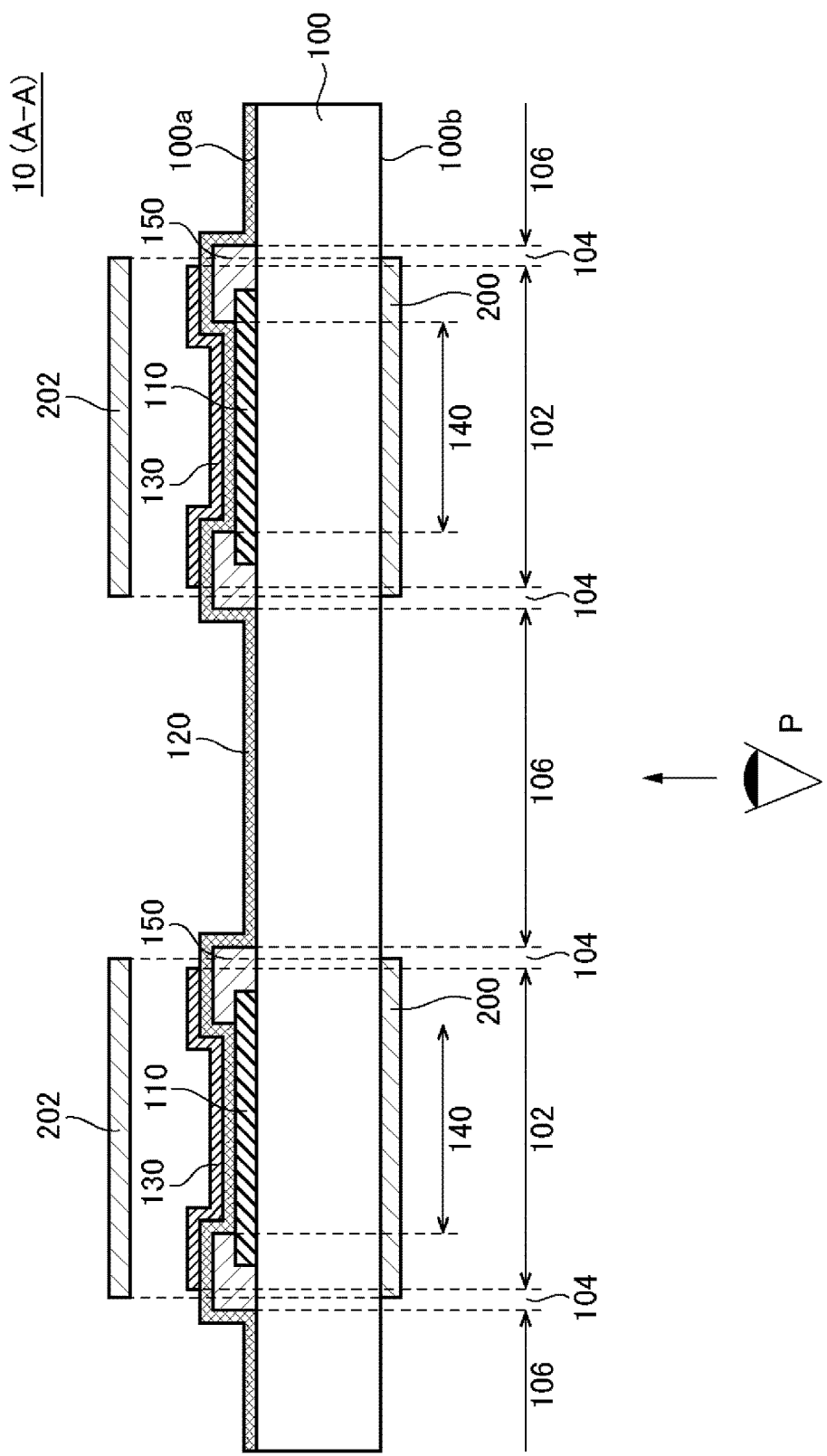
FIG. 6 is a cross-sectional view of a configuration of a light-emitting device according to Modification Example 4.

FIG. 6 is a cross-sectional view of a configuration of a light-emitting device 10 according to Modification Example 4. The light-emitting device 10 according to the present modification example has the same configuration as that of the light-emitting device 10 according to the embodiment, except that a second optical filter 202 is included.

The second optical filter 202 is located on the opposite side of the first optical filter 200 with the light-emitting unit 140 as a reference. In other words, the light-emitting unit 140 is located between the first optical filter 200 and the second optical filter 202. Further, when the light-emitting device 10 includes a sealing member, the second optical filter 202 is attached to the sealing member. More specifically, the second optical filter 202 is attached to a surface of the sealing member on the side opposite to the light-emitting unit. When such a configuration is adopted, the light-emitting device 10 according to the present modification example can be manufactured by adding a process of forming the second optical filter 202 to an existing method of manufacturing of the light-emitting device 10. Therefore, changes in the manufacturing process of the light-emitting device 10 are minimized. Any of methods exemplified as forming methods for the first optical filter 200 can be used as a forming method for the second optical filter 202. Meanwhile, the sealing member may be any sealing member that has translucency. For example, the sealing member may include a so-called hollow sealing structure using a translucent member such as glass, or may be a film such as a laminated film or an inorganic film.

The color of the second optical filter 202 is, for example, complementary to the color of the first optical filter 200. In this case, light transmittance of white light in a region where the first optical filter 200 and the second optical filter 202 are overlapped is equal to or less than 5%, preferably substantially equal to 0%. In addition, the second optical filter 202 may have a property of not transmitting light more than a certain amount over the entire range of visible light (for example, a property the same as that of a smoked film for window glass). In this case, the light transmittance of white light with respect to the second optical filter 202 is, for example, equal to or greater than 20% and equal to or less than 70% without being limited to this range.

As an example, white light indicates light which corresponds to a light source color of a fluorescent lamp or LED in ranges defined by JIS, for example, as daylight, natural white, white, warm white, and incandescent. Daylight, natural white, white, warm white, and incandescent are as defined by JIS Z 9112. According to this definition, daylight is a region surrounded by a quadrangle with vertices at (0.3274, 0.3673), (0.3282, 0.3297), (0.2998, 0.3396), and (0.3064, 0.3091) in the xy chromaticity diagram, and the correlated color temperature Tcp thereof is 5,700 to 7,100 (K). In addition, natural white is a region surrounded by a quadrangle with vertices at (0.3616, 0.3875), (0.3552, 0.3476), (0.3326, 0.3635), and (0.3324, 0.3296) in the xy chromaticity diagram, and the correlated color temperature Tcp thereof is 4,600 to 5,500 (K). Further, white is a region surrounded by a quadrangle with vertices at (0.3985, 0.4102), (0.3849, 0.3668), (0.3652, 0.3880), and (0.3584, 0.3499) in the xy chromaticity diagram, and the correlated color temperature Tcp thereof is 3,800 to 4,500 (K). In addition, warm white is a region surrounded by a quadrangle with vertices at (0.4305, 0.4218), (0.4141, 0.3834), (0.3966, 0.4044), and (0.3856, 0.3693) in the xy chromaticity diagram, and the correlated color temperature Tcp thereof is 3,250 to 3,800 (K). Further, incandescent is a region surrounded by a quadrangle with vertices at (0.4834, 0.4832), (0.4594, 0.3971), (0.4305, 0.4218), and (0.4153, 0.3862) in the xy chromaticity diagram, and the correlated color temperature Tcp thereof is 2,600 to 3,250 (K). As another example, white light may be sunlight. However, white light is not limited to these examples, and may be, for example, light which includes light of a wavelength of red (a wavelength of 640 nm), green (a wavelength of 520 nm), and blue (a wavelength of 450 nm). Moreover, as defined in JIS Z 8120, white light may be emission which is recognized as white by the naked eyes or light composed of a normal continuous spectrum.

Viewed from a direction perpendicular to the substrate 100, equal to or more than 90% of the second optical filter 202 is preferably overlapped with the first optical filter 200. In addition, equal to or more than 90% of the first optical filter 200 is preferably overlapped with the second optical filter 202.

For example, in an example illustrated in FIG. 6, a second optical filter 202 is provided facing each of a plurality of first optical filters 200. In other words, one second optical filter 202 is provided for one first optical filter 200. In this case, the width of the second optical filter 202 in a direction in which the light-emitting units 140 are aligned is, for example, equal to or greater than 95% and equal to or less than 105% of the width of the first optical filter 200. Further, the width of the second optical filter 202 in the extending direction of the light-emitting units 140 is, for example, equal to or greater than 95% and equal to or less than 105% of the width of the first optical filter 200. However, the width of the second optical filter 202 is not limited to this range.

Figure 7:
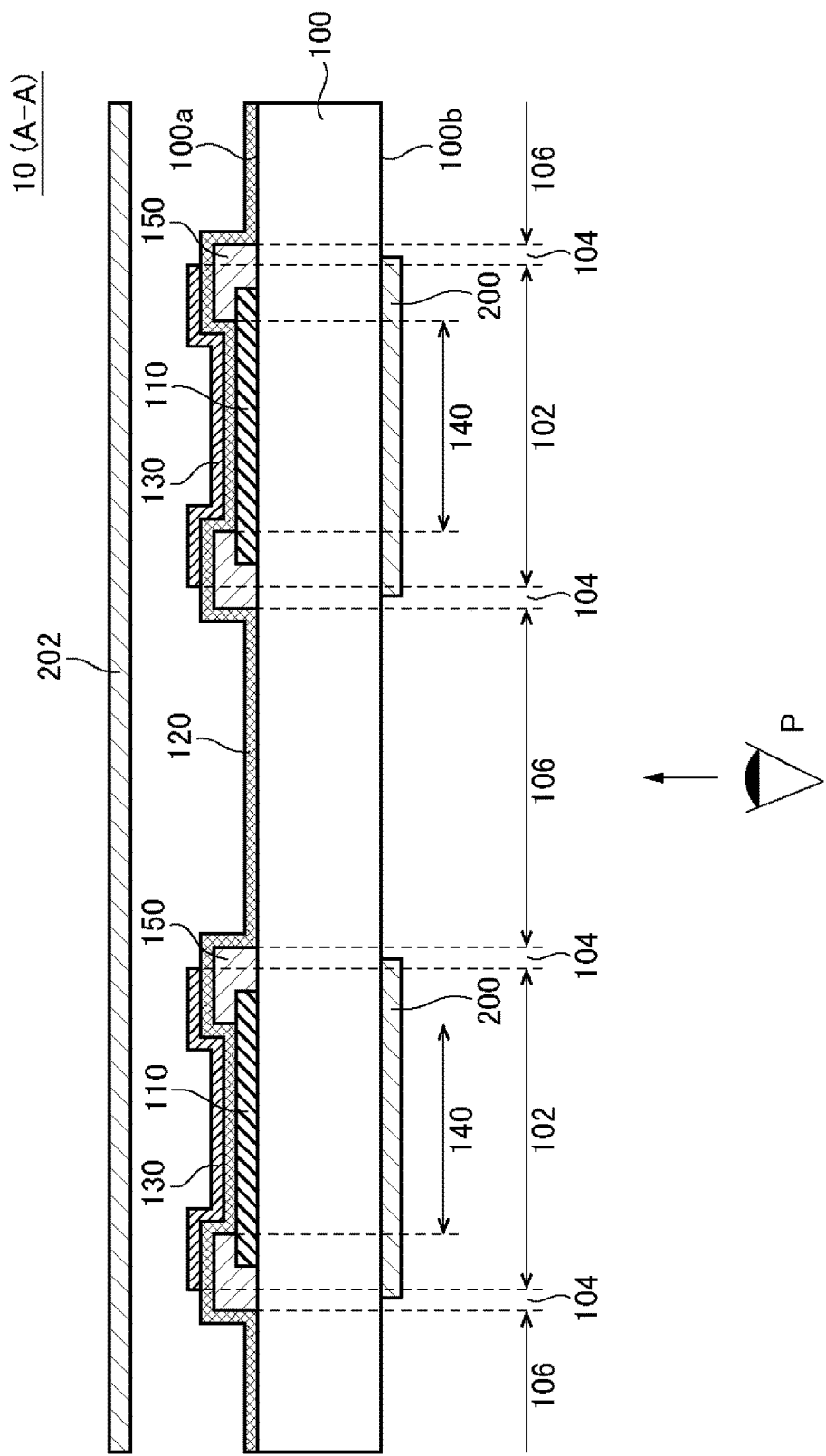
FIG. 7 a cross-sectional view of a configuration of a light-emitting device according to a modification example of FIG. 6.

Meanwhile, in a case where the second optical filter 202 has the property the same as that of a smoked film for window glass as described above (for example, in a case where the filter is light brown or black), as illustrated in FIG. 7, one second optical filter 202 may be provided to overlap with a plurality of the first optical filters 200. In this case, the second optical filter 202 is also provided in the third region 106 which is located between the light-emitting units 140. In addition, the second optical filter 202 may be provided in almost the entire area of the substrate 100.

In the present modification example also, the same as the embodiment, it is possible to obtain a sharp peak of emission spectrum of the light-emitting unit 140 and to maintain translucency of the light-emitting device 10. Further, since the second optical filter 202 is included in a location overlapping with the first optical filter 200, when light other than light emitted from the light-emitting unit 140 is transmitted through the first optical filter 200 at a timing at which the light-emitting unit 140 is not emitting light, it is possible to inhibit at least a portion of the light-emitting device 10 from appearing to have the same color as the first optical filter 200.

Meanwhile, the light-emitting device 10 according to modification examples 1 to 3 may include the second optical filter 202 described in the present modification example.

Example

Figure 8:
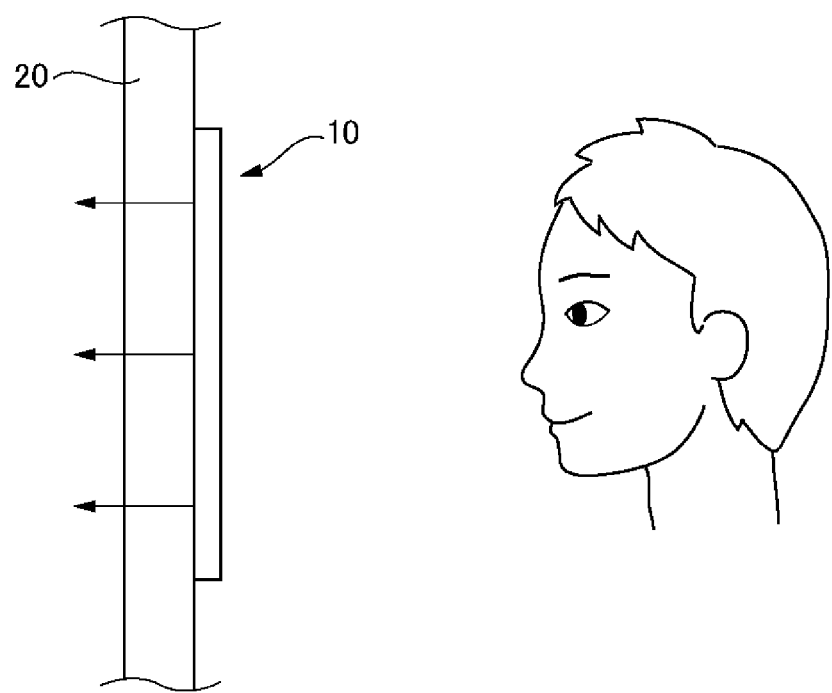
FIG. 8 is a cross-sectional view to illustrate a use of a light-emitting device according to an example.

FIG. 8 is a cross-sectional view to describe a use of a light-emitting device 10 according to an example. In the present example also, the light-emitting device 10 is attached to one surface of a light-transmitting member 20. The light-transmitting member 20 is, for example, a window glass. In addition, the light-emitting device 10 is a part of a light-emitting system. This light-emitting system contains at least the light-emitting device 10 and the light-transmitting member 20 and includes a control unit (not shown in the drawing) which controls the light-emitting device 10, a power supply unit (not shown in the drawing), fixing members to fix the light-transmitting member 20, and mounting members to mount the light-emitting device 10 on the light-transmitting member 20. When the light-transmitting member 20 is a window glass of a building or a mobile object (for example, an automobile, a train, or an airplane), a light-emitting surface (a second surface 100b) of the light-emitting device 10 faces, for example, the light-transmitting member 20. That is, light emitted from the light-emitting device 10 is emitted to the outside of the building or the mobile object through the light-transmitting member 20. Meanwhile, in a case where the light-emitting unit 140 is provided on the outer surface of the building or the mobile object, the light-emitting surface of the substrate 100 faces the side opposite to the light-transmitting member 20. Further, the light-emitting device 10 may be located at eye level, higher than eye level, or lower than eye level. In addition, the light-transmitting member 20 may include an inclination.

In the present example, the light-emitting device 10 has a configuration shown in any of the embodiments and each modification example. Therefore, it is possible to obtain a sharp peak of light emitted from the light-emitting device 10 through the light-transmitting member 20. Further, it is possible to maintain translucency of a region of the light-transmitting member 20 provided with the light-emitting device 10.

The light emission luminescence of the light-emitting device 10 changes according to the measurement (recognition) condition, for example, the position and the angle of a person's eyes. Usually, the light emission luminescence is the highest in front of the light-emitting device 10 (in a direction perpendicular to the light-emitting device 10). Then, there is a case where the light emission luminescence is desirably the highest at a desired angle such as when, for example, light emission of the light-emitting device 10 desirably has the maximum luminance when viewed in the horizontal direction with respect to the light transmitting member 20 and the light-emitting device 10 having an inclination. In such a case, the light-emitting device 10 may be designed so that certain wavelengths strengthen each other by using a resonant structure. In this case, the light emission luminescence at the desired angle increases. However, there is a case where a hue of light emission of the light-emitting device 10 observed at the desired angle appears to be different from a hue observed at another angle.

Specifically, in a case where the light emission at a certain wavelength peak value is strengthened by the resonant structure (for example, a wavelength peak of red emission is around 630 nm), at a desired angle, the light emission at 630 nm is observed (for example, an angle of an inclination being viewed in a direction horizontal to the light-transmitting member 20) However, at angles other than the angle (for example, when viewed in a direction perpendicular to the light-transmitting member 20 having the inclination), the color of the light emission is different. Due to the resonant structure, at angles other than the desired angle, light emission of a certain wavelength peak (a wavelength of around 630 nm) is relatively weak. As a result, a change in hues occurs in the light-emitting device 10 according to observation points. In contrast, in the present example, for example, by providing the first optical filter 200 which reduces light of a wavelength other than 630 nm, when a person changes the angle with respect to the light-emitting device 10, it is possible to inhibit the hue of the light-emitting device 10 from changing.

As described above, although the embodiments and examples of the present invention have been set forth with reference to the accompanying drawings, they are merely illustrative of the present invention, and various configurations other than those stated above can be adopted.

This application claims priority from Japanese Patent Application No. 2016-025292, filed Feb. 12, 2016, the disclosure of which is incorporated by reference in its entirety.

The invention claimed is:

1. A light-emitting device comprising:
a light-transmitting substrate;
a plurality of light-emitting units provided separated from each other on a first surface of the substrate, each light-emitting unit comprising a light-transmitting first electrode, a light-reflective second electrode, and an organic layer located between the first electrode and the second electrode;
a light-transmitting region located between the light-emitting units, the region transmitting light in a thickness direction;
a first optical filter provided on a light-emitting surface of the substrate, the first optical filter overlapped with the light-emitting unit and not overlapped with at least a portion of the light-transmitting region, and
a second optical filter located on an opposite side of the first optical filter with the light-emitting unit as a reference and having a color different from that of the first optical filter.

2. The light-emitting device according to claim 1, further comprising a light-transmitting insulating layer that defines the light-emitting unit,
wherein the light-transmitting region comprises:
a first light-transmitting region that is overlapped with the insulating layer and not overlapped with the second electrode; and
a second light-transmitting region neither overlapped with the insulating layer nor the second electrode, and
wherein an edge of the first optical filter is overlapped with the second electrode or the first light-transmitting region.

3. The light-emitting device according to claim 1, further comprising a light-transmitting insulating layer that defines the light-emitting unit,
wherein the light-transmitting region comprises:
a first light-transmitting region that is overlapped with the insulating layer and not overlapped with the second electrode; and
a second light-transmitting region neither overlapped with the insulating layer nor the second electrode,
wherein the edge of the first optical filter is located in the second light-transmitting region, and
wherein a distance from the edge of the first optical filter to the insulating layer is equal to or less than 10% of a width of the second light-transmitting region.

4. The light-emitting device according to claim 1, further comprising a light-transmitting sheet member that is provided with the first optical filter,
wherein the first optical filter is provided in a region of the sheet member that is overlapped with at least a portion of the light-emitting unit and is not provided in a region of the sheet member that is overlapped with at least a portion of the light-transmitting region.

5. The light-emitting device according to claim 1,
wherein a peak wavelength of a transmission spectrum of the first optical filter is within an emission spectrum of the light-emitting unit that is overlapped with the first optical filter.

6. The light-emitting device according claim 1,
wherein the second optical filter has a light transmittance that is equal to or greater than 20% and equal to or less than 70% with respect to white light.

7. The light-emitting device according claim 1,
wherein a light transmittance of white light in a region where the first optical filter and the second optical filter are overlapped is equal to or less than 5%.

8. The light-emitting device according to claim 1,
wherein the color of the second optical filter is a complementally color of the color of the first optical filter.

9. The light-emitting device according claim 1,
wherein a width of the second optical filter is equal to or greater than 95% and equal to or less than 105% of a width of the first optical filter.

* * * * *